(12) United States Patent
Ferianz

(10) Patent No.: US 6,600,366 B2
(45) Date of Patent: Jul. 29, 2003

(54) DIFFERENTIAL LINE DRIVER CIRCUIT

(75) Inventor: Thomas Ferianz, Glanegg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/951,645

(22) Filed: Sep. 13, 2001

(65) Prior Publication Data

US 2002/0070801 A1 Jun. 13, 2002

(30) Foreign Application Priority Data

Sep. 15, 2000 (DE) .......................... 100 45 721

(51) Int. Cl.⁷ ................................................ H03F 3/45
(52) U.S. Cl. ...................... 330/69; 330/124 R; 330/104
(58) Field of Search ............................... 330/69, 124 R, 330/104, 260, 295

(56) References Cited

U.S. PATENT DOCUMENTS

| 3,516,006 A | * | 6/1970 | Donjon | 330/69 |
| 4,361,811 A | * | 11/1982 | Ormond | 328/127 |
| 4,887,045 A | * | 12/1989 | Nakayama | 330/69 |
| 4,922,207 A | * | 5/1990 | Botti | 330/84 |
| 5,856,758 A | | 1/1999 | Joffe et al. | |

OTHER PUBLICATIONS

Tietze, U.; Schenk, Ch.; Halbleiter–Schaltungstechnik.

* cited by examiner

Primary Examiner—Henry Choe
(74) Attorney, Agent, or Firm—Welsh & Katz, Ltd.

(57) ABSTRACT

Differential line driver circuit for driving a line signal output via a signal line.

13 Claims, 3 Drawing Sheets

DIFFERENTIAL LINE DRIVER CIRCUIT

The invention relates to a differential line driver circuit for driving a line signal output via a line, in particular an xDSL line signal.

Tietze, U.; Schenk, Ch.: Halbleiter-Schaltungstechnik [semiconductor circuitry], 11th edition, Berlin, Springer, 1999, pages 819, 820, 827, ISBN 3-540-64192-0 discloses a voltage-controlled current source for grounded consumers with an adjustable output impedance. The use of two voltage-controlled current sources for floating consumers is likewise known from this document.

U.S. Pat. No. 5,856,758 describes a driver amplifier circuit with a positive feedback. In this case, an impedance is connected between the output terminal and a non-inverting input of an operational amplifier.

FIG. 1 shows a differential line driver circuit according to the prior art. The driver circuit has two inputs E1, E2, to which the input signal $U_{ein}$ to be amplified is applied. The two driver inputs E1, E2 are respectively connected to the non-inverting inputs of two operational amplifiers $OP_I$, $OP_{II}$. The two operational amplifiers are voltage feedback operational amplifiers which are supplied with a supply voltage, $U_V = VDD - VSS$. The outputs of the operational amplifiers $OP_I$, $OP_{II}$ are respectively fed back to the inverting inputs (−) via feedback impedances $R_{RI}$, $R_{RII}$. The two inverting inputs (−) of the two operational amplifiers $OP_I$, $OP_{II}$ are connected to one another via an adjusting impedance $R_E$ for adjusting a voltage gain. The two outputs of the operational amplifiers $OP_I$, $OP_{II}$ are connected to the signal line via line matching impedances $R_{AI}$, $R_{AII}$, via the two driver signal outputs A1, A2. The signal line has a load impedance $Z_{Last}$ of, for example, 100 ohms.

The matching impedances $R_{AI}$, $R_{AII}$ serve for avoiding signal reflections on the signal line L.

It holds for the output impedance of the driver circuit according to the prior art, as is illustrated in FIG. 1, that:

$$Z_{aus} = R_{AI} + R_{AII} = Z_L \quad (1)$$

The two matching impedances $R_{AI}$, $R_{AII}$, and the line impedance $Z_L$ form a voltage divider, it holding in this case that:

$$U_{opAUS} = 2 \cdot U_{aus} \quad (2)$$

The operational amplifiers $OP_I$, $OP_{II}$ must therefore make two volts of output voltage available for each volt of output voltage $U_{AUS}$. The output voltage $U_{AUS}$ to be made available at the outputs A1, A2 is prescribed by the technical application and is, for example, 17.6 volts in the case of ADSL driver circuits. The operational amplifiers must therefore make available the voltage $U_{opAUS}$ of 35.2 volts at their output. The supply voltage $U_{versorgung}$ is:

$$U_{versorgung} = V_{DD} - V_{SS} \quad (3)$$

A supply voltage of the two operational amplifiers must be higher in every case than the output voltage $U_{opAUS}$ to be output at its outputs:

$$U_{versorgung} \geq U_{opAUS} = 2 \cdot U_{aus} \quad (4)$$

A supply voltage $U_{versorgung}$ of 42 volts is typically required for ADSL applications.

The driver circuit according to the prior art illustrated in FIG. 1 therefore has the disadvantage that it requires a very high supply voltage $U_{versorgung}$ and has a very high power loss, which is caused by the two line matching impedances $R_{AI}$, $R_{AII}$.

It is therefore the object of the present invention to create differential line driver circuits which manage with a low supply voltage and have a low power loss.

This object is achieved according to the invention by means of a differential line driver circuit having the features specified in patent claim 1.

The invention creates a differential line driver circuit for driving a line signal output via a signal line, having a first input terminal for applying a first input signal, a second input terminal for applying a second input signal, a first operational amplifier, whose non-inverting input is connected to the first input terminal of the line driver circuit, and whose output is connected to the inverting input via a feedback impedance, a second operational amplifier, whose non-inverting input is connected to the second input terminal of the line driver circuit, and whose output is connected to the inverting input via a feedback impedance, an adjusting impedance for gain adjustment which is connected between the two inverting inputs of the two operational amplifiers, a first matching impedance, which is connected between the output of the first operational amplifier and a first output terminal of the line driver circuit, a second matching impedance, which is connected between the output of the second operational amplifier and a second output terminal of the line driver circuit, the differential line driver circuit additionally having a first positive feedback impedance which is connected between the first output terminal of the line driver circuit and the inverting input of the second operational amplifier, and having a second positive feedback impedance, which is connected between the output of the line driver circuit and the inverting input of the first operational amplifier, the output impedance of the line driver circuit being matched to the impedance of the line.

The output impedance of the differential line driver circuit is preferably fixed by the product of an output impedance synthesis factor and the sum of the impedances of the two matching impedances.

In a preferred embodiment of the line driver circuit according to the invention, the output impedance synthesis factor can be adjusted as a function of the positive feedback impedances and the feedback impedances.

The first positive feedback impedance and the second positive feedback impedance preferably have the same impedances.

The first feedback impedance and the second feedback impedance likewise preferably have the same impedance.

In the case of a first embodiment of the differential line driver circuit, the two operational amplifiers are voltage feedback operational amplifers.

In an alternative embodiment of the differential line driver circuit, the two operational amplifiers are current feedback operational amplifiers.

In a further embodiment of the differential line driver circuit, the adjusting impedance has an infinitely high impedance.

The output impedance synthesis factor is preferably greater than one.

In a particularly preferred embodiment, the output impedance synthesis factor is approximately five.

The differential line driver circuit according to the invention is preferably of fully symmetrical design.

The input impedance of the line driver circuit according to the invention preferably has a high input impedance which corresponds to the high input impedance of an operational amplifier.

The line signals amplified by means of the line driver circuit according to the invention are preferably xDSL signals.

Preferred embodiments of the differential line driver circuit according to the invention are described below with reference to the attached figures in order to explain features essential to the invention.

Figure 1:
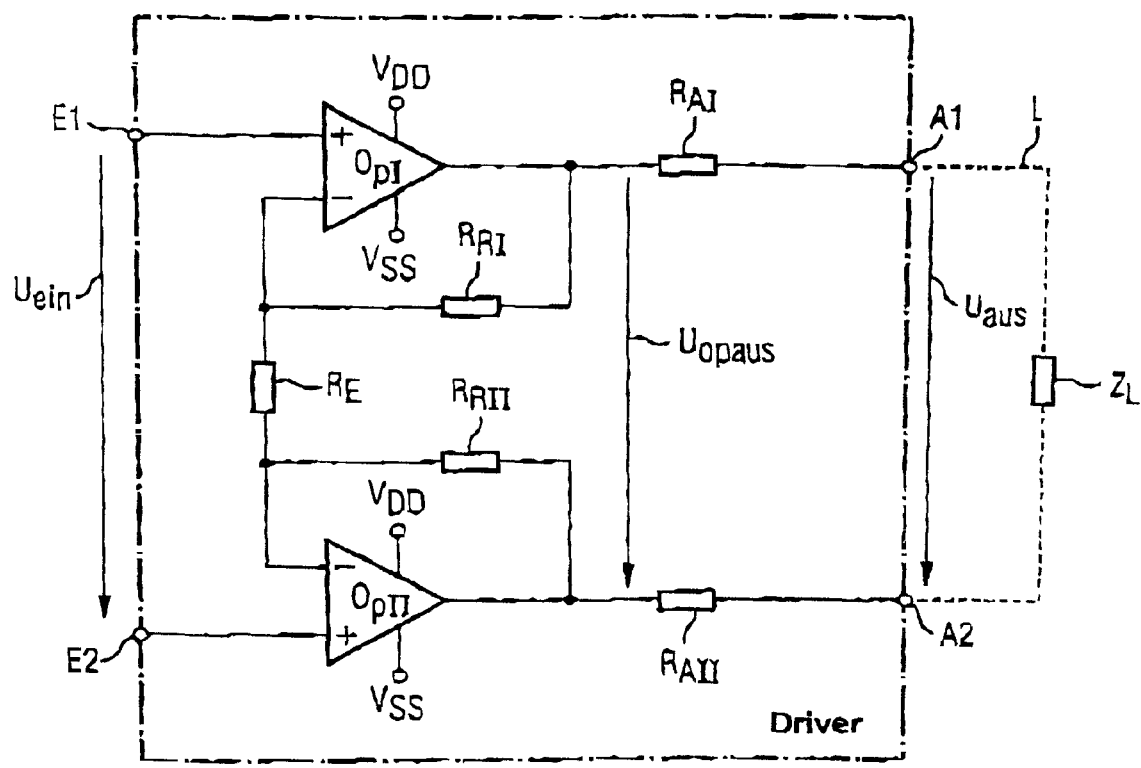
FIG. 1 shows a differential line driver circuit according to the prior art.
Figure 2:
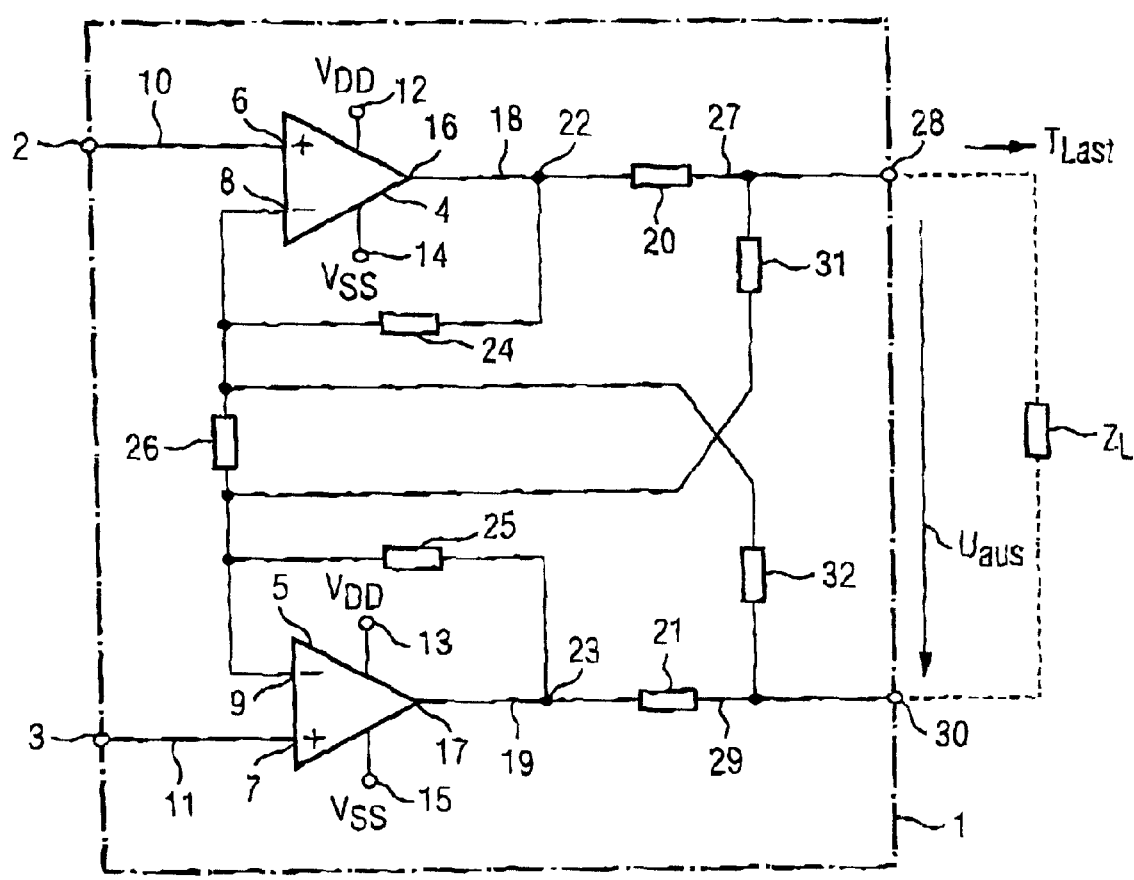
FIG. 2 shows a first embodiment of the differential line driver circuit in accordance with the invention.

The first embodiment of the differential line driver circuit 1 shown in FIG. 2 has a first input terminal 2 for the application of a first input signal, and a second input terminal 3 for the application of a second input signal. The two input signals are generally differential signals, that is to say the second input signal is inverted relative to the first input signal.

The line driver circuit 1 contains two operational amplifiers 4, 5, which in each case have a non-inverting input 6, 7 and an inverting input 8, 9. The non-inverting inputs 6, 7 are connected directly to the input terminals 2, 3 via lines 10, 11. The two operational amplifiers 4, 5 are supplied via power supply terminals 12, 13 with a positive supply voltage $V_{DD}$, and via supply voltage terminals 14, 15 with a negative supply voltage $V_{SS}$ and a supply voltage $U_{versorgung}$. The two operational amplifiers 4, 5 respectively have signal outputs 16, 17 which are connected via lines 18, 19 to matching impedances 20, 21. The signal outputs 16, 17 are connected at branching nodes 22, 23 to feedback impedances 24, 25 which respectively feed back the signal output 16, 17 of the operational amplifier 4, 5 to the inverting signal input 8, 9 thereof.

Two inverting signal inputs 8, 9 of the two operational amplifiers 4, 5 are connected to one another via an adjusting impedance 26.

The first matching impedance 20 connected to the signal output of the first operational amplifier 4 is connected via a line 37 to a first output terminal 28 of the differential line driver circuit 1. The second matching impedance 21 connected to the signal output 17 of the second operational amplifier 5 is connected via a line 29 to a second output terminal 30 of the differential line driver circuit 1. A first positive feedback impedance 31 is connected between the first output terminal 28 of the line driver circuit 1 and the inverting input 9 of the second operational amplifier 5. A further positive feedback impedance 32 is connected between the second output terminal 30 of the line driver circuit 1 and the inverting input 8 of the first operational amplifier 4. As may be seen from FIG. 2, the differential line driver circuit 1 is of fully symmetrical design.

Via the positive feedback impedances 31, 32, a positive feedback signal is coupled into the inverting signal inputs 8, 9 of the two operational amplifiers 4, 5 from the signal output 16, 17 of the respective other operational amplifier 4, 5. Coupling from the signal output of the respective other antiphase operational amplifier effects a positive feedback which leads to a synthesis of the output impedance $Z_{AUS}$ of the differential line driver circuit 1.

It holds for the output impedance $Z_{AUS}$ of the line driver circuit 1 that:

$$Z_{AUS} = m \cdot (R_{20} + R_{21}) \qquad (5)$$

m being the output impedance synthesis factor, $R_{20}$ being the impedance of the matching impedance 20, and $R_{21}$ being the impedance of the matching impedance 21.

The output impedance $Z_{AUS}$ of the line driver circuit 1 is matched to the impedance $Z_L$ on the line to be driven. It therefore holds:

$$Z_{AUS} = Z_L \qquad (6)$$

The impedance synthesis factor m can be adjusted as a function of the impedances of the positive feedback impedances and the feedback impedances 24, 25. The two positive feedback impedances 31, 32 have the same positive feedback impedance:

$$R_{31} = R_{32} = R_{MK} \qquad (7)$$

The two feedback impedances 24, 25 likewise have the same feedback impedance:

$$R_{24} = R_{25} = R_{RK} \qquad (8)$$

It follows for the output impedance synthesis factor m that:

$$m = \frac{R_{MK}}{R_{MK} - R_{RK}} \qquad (9)$$

The output voltage $U_{ausop}$ between the two operational amplifiers 4, 5, that is to say between the signal outputs 16, 17, is:

$$U_{ausop} = (1 + 1/m) U_{aus} \qquad (10)$$

The output impedance synthesis factor m is always greater than one.

With increasing output impedance synthesis factor m, the requisite signal voltage between the two signal outputs 16, 17 of the two operational amplifiers 4, 5 drops in order to reach the prescribed requisite output driver voltage $U_{aus}$.

Is the impedance $Z_L$ between the two output terminals 28, 30 is, for example, 100 ohms, the overall output impedance $Z_{aus}$ of the driver circuit 1 must likewise be 100 ohms. If the output impedance synthesis factor m is adjusted, for example, to five, only 10 ohms are required in each case as impedance values of the two matching impedances 20, 21 in order to achieve the output impedance (see equation (5)). Again, the requisite supply voltage $U_{versorgung}$ made available for the two operational amplifiers 4, 5 can be lowered at the supply voltage terminals 14, 17 or 13, 15 owing to the output impedance synthesis factor m, selected to be greater than one, and, thus, the lower requisite output signal voltage $U_{opaus}$ between the two signal outputs 16, 17 of the two operational amplifiers 4, 5.

The power loss the differential driver circuit 1 is:

$$P_{verlust} = V_{Last} \cdot U_{Versorgung} + I_{Ruhe} U_{versorgung} - P_{signal} \qquad (11)$$

$I_{Last}$ being the load current output to the line, $I_{Ruhe}$ being the quiescent current of the operational amplifiers, $U_{versorgung}$ being the requisite supply voltage, and $P_{signal}$ being the output signal power.

The output signal power is:

$$P_{signal} = \frac{Uop_{ms}^2}{R_{20} + R_{22} + Z_L} \quad (12)$$

The power loss $P_{Verlust}$ of the differential line driver circuit according to the invention drops owing to the lower requisite supply voltage $U_{Versorgung}$.

80% of the maximum possible output level reduction already results from an output impedance synthesis factor m=5. Output impedance synthesis factors m of more than five do not lead to any substantial saving in power loss.

Since the output impedances $R_{20}$, $R_{21}$ of the two line matching impedances 20, 21 are substantially smaller than the impedances of the adjusting impedance 26, the feedback impedances 24, 25 and the positive feedback impedances 31, 32

$$R_{20}, R_{21} << R_{26}, R_{24}, R_{25}, R_{31}, R_{32} \quad (13),$$

it holds for the open-circuit gain ($Z_L=\alpha$) of the line driver circuit 1 according to the invention that:

$$G_{Leerlauf} = \frac{2}{R_{26}} \cdot \frac{R_{RK} \cdot R_{MK}}{R_{MK} - R_{RK}} + \frac{R_{MK} + R_{RK}}{R_{MK} - R_{RK}} \quad (14)$$

Introduction of the output impedance synthesis factor results in the open-circuit gain $G_{Leerlauf}$:

$$G_{Leerlauf} = 2 \cdot m\left(\frac{R_{RK}}{R_{26}} + 1\right) - 1$$

Figure 3:
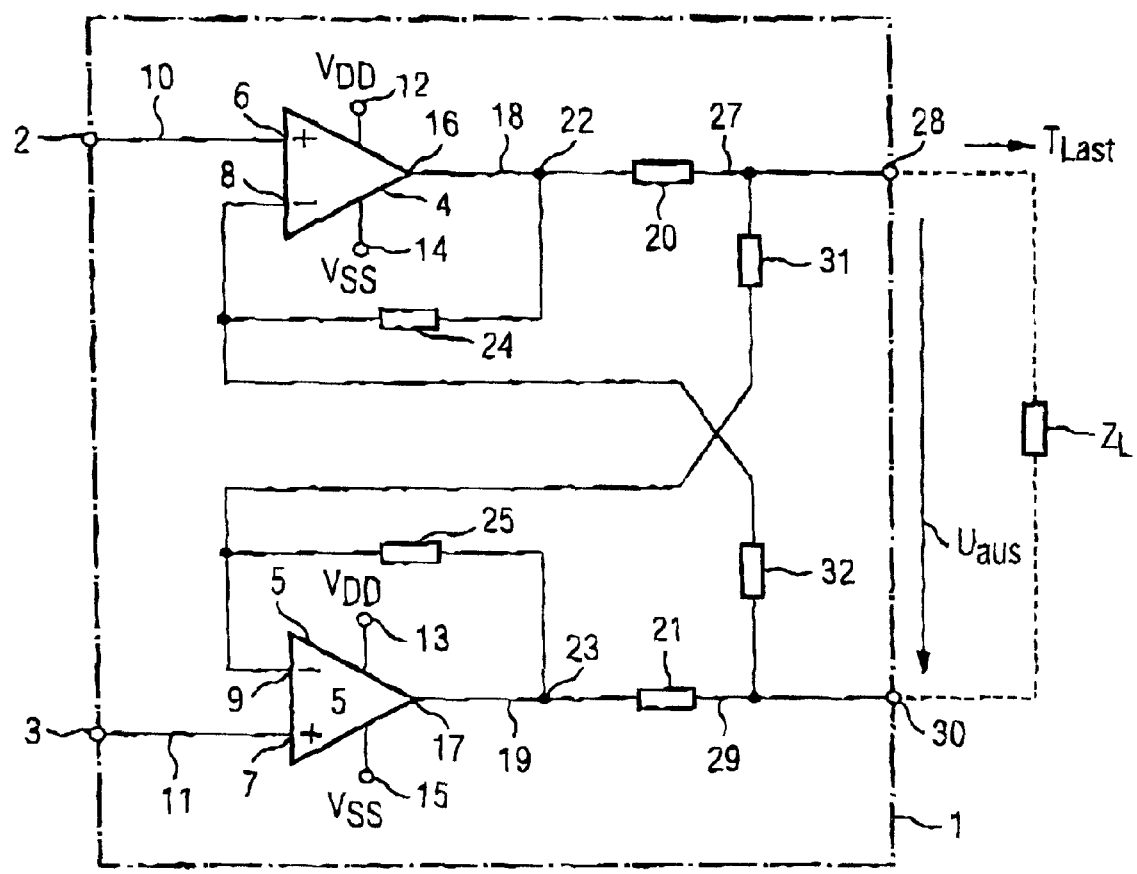
FIG. 3 shows a second embodiment of the differential line driver circuit according to the invention.

FIG. 3 shows a particular embodiment of the differential line driver circuit 1 according to the invention, in the case of which the adjusting impedance 26 has an infinitely high impedance or has been removed from the circuit.

The embodiment illustrated in FIG. 3 has the minimum possible open-circuit gain $G_{Leerlauf}$, because $R_{26}$ tends to infinity.

$$G_{Leerlauf} = 2 \cdot m - 1 \text{ when } R_{26} = \infty \quad (16)$$

The high input impedance of the differential line driver circuit 1 according to the invention promotes the use of current feedback operational amplifiers, since, when the inverting structure is used, it is possible, owing to the feedback impedances of very low resistance, for the input impedance easily to reach values of around 100 ohms, and thus to enter the order of magnitude of the load to be driven. In the case of current feedback operational amplifiers, the feedback impedances constitute the transconductance of the input stage. The frequency bandwidth of the line driver circuit 1 can be increased in conjunction with the use of current feedback current amplifiers 4, 5 by lowering the impedance of the feedback impedances 24, 25. Normal impedance values for the feedback impedances in the case of broadband line drivers with current feedback operational amplifiers are at 200 to 1000 ohms. The positive feedback via the positive feedback impedances 31, 32 attenuates the negative feedback via the feedback impedances 24, 25 during the impedance synthesis. It is possible through the use of current feedback operational amplifiers to counteract a drop in the loop gain, and thus to counteract the drop in the linearity important for broadband line drivers by reducing the feedback impedances of the feedback impedances 24, 25. The loop gain is thereby increased again. If the impedances are reduced in such a way that the loss in the loop gain is compensated by the impedance synthesis, there is also no change in the stability relationships.

The impedances 20, 21, 24, 25, 26, 31, 32 are complex impedances in an alternative embodiment, and so the differential line driver circuit 1 according to the invention likewise has a complex output impedance $Z_{aus}$.

In a further embodiment, the impedances of the differential line driver circuit 1 can be switched between various impedance values, so that the driver circuit 1 can be matched adaptively to different line impedances $Z_L$ by programming.

By removing the feedback signal at the signal output of the respective other antiphase operational amplifier, the non-inverting signal inputs 6, 7 of the two operational amplifiers 4, 5 remain free of feedback impedances, and the input impedance of the driver circuit 1 is determined by the impedance of the operational amplifiers 4, 5. Furthermore, the input impedance of the line driver circuit 1 according to the invention has a very high input impedance in the megaohm range such that the signal source does not itself require a low output impedance. Power loss savings of, for example, 40% for a selected synthesis factor m=5 can be achieved by means of the line driver circuit 1 according to the invention in conjunction with the positive crosswise feedback via the positive feedback impedances 31, 32.

A maximum power loss saving of 50% is achieved for a synthesis factor m=∞.

What is claimed is:

1. A differential line driver circuit for driving a line signal output via a signal line, having:

(a) a first input terminal for applying a first input signal;

(b) a second input terminal for applying a second input signal, (c) a first operational amplifier, whose non-inverting input is connected to the first input terminal of the line driver circuit, and whose signal output is connected to the inverting input of the first operational amplifier via a first feedback impedance, (d) a second operational amplifier, whose non-inverting input is connected to the second input terminal of the line driver circuit, and whose signal output is connected to the inverting input of the second operational amplifier via a second feedback impedance, (e) an adjusting impedance for gain adjustment, the adjusting impedance being connected between the inputs of the two operational amplifiers, (f) a first matching impedance, which is connected between the signal output of the first operational amplifier and a first output terminal of the line driver circuit, (g) a second matching impedance, which is connected between the signal output of the second operational amplifier and a second output terminal of the line driver circuit, (h) a first positive feedback impedance, which is connected between the first output terminal of the line driver circuit and the inverting input of the second operational amplifier, and (i) a second positive feedback impedance, which is connected between the second output terminal of the line driver circuit and the inverting input of the first operational amplifier, wherein (j) the output impedance ($Z_{AUS}$) of the line driver circuit is matched to the impedance ($Z_L$) of the line.

2. The differential line driver circuit as claimed in claim 1, wherein the output impedance ($Z_{AUS}$) is determined by the product of an output impedance synthesis factor (m) and the sum of the impedances of the two matching impedances.

3. The differential line driver circuit as claimed in claim 2, wherein the output impedance synthesis factor (m) can be adjusted as a function of the first and second positive feedback impedances and the first and second feedback impedances.

4. The differential line driver circuit as claimed in claim 1, wherein the first positive feedback impedance and the second positive feedback impedance have the same impedance.

5. The differential line driver circuit as claimed in claim 1, wherein the first feedback impedance and the second feedback impedance have the same impedance.

6. The differential line driver circuit as claimed in claim 1, wherein the two operational amplifiers are voltage feedback operational amplifiers.

7. The differential line driver circuit as claimed in claim 1, wherein the two operational amplifiers are current feedback operational amplifiers.

8. The differential line driver circuit as claimed in claim 1, wherein the adjusting impedance has an infinitely high impedance.

9. The differential line driver circuit as claimed in claim 1, wherein the output impedance synthesis factor (m) is greater than one.

10. The differential line driver circuit as claimed in claim 1, wherein the output impedance synthesis factor (m) is approximately five.

11. The differential line driver circuit as claimed in claim 1, wherein the line driver circuit is of symmetrical design.

12. The differential line driver circuit as claimed in claim 1, wherein the adjusting impedance, the feedback impedances, the positive feedback impedances and the matching impedances are complex impedances.

13. The differential line driver circuit as claimed in claim 1, wherein the impedance values of the adjusting impedance, the feedback impedances, the positive feedback impedances and the matching impedances can be switched over by means of switching devices.

* * * * *